US012588249B2

(12) United States Patent
Lee et al.

(10) Patent No.: US 12,588,249 B2
(45) Date of Patent: Mar. 24, 2026

(54) INTEGRATED CIRCUIT DEVICES INCLUDING A CROSS-COUPLED STRUCTURE

(71) Applicant: Samsung Electronics Co., Ltd.,
Suwon-si (KR)

(72) Inventors: Seungyoung Lee, Clifton Park, NY
(US); Saehan Park, Clifton Park, NY
(US)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 839 days.

(21) Appl. No.: 17/503,486

(22) Filed: Oct. 18, 2021

(65) Prior Publication Data

US 2023/0047840 A1      Feb. 16, 2023

Related U.S. Application Data

(60) Provisional application No. 63/232,679, filed on Aug.
13, 2021.

(51) Int. Cl.
*H10D 30/43* (2025.01)
*B82Y 10/00* (2011.01)
(Continued)

(52) U.S. Cl.
CPC ....... *H10D 30/6755* (2025.01); *H03B 5/1228*
(2013.01); *H10D 30/6757* (2025.01)

(58) Field of Classification Search
CPC ........... H01L 29/7869; H01L 29/78696; H01L
29/0673; H01L 21/8221; H01L
21/823871; H01L 27/0207; H01L 29/775;
H01L 27/092; H01L 27/0688; H01L
23/528; H01L 23/535; H03B 5/1228;
B82Y 10/00
See application file for complete search history.

(56) References Cited

U.S. PATENT DOCUMENTS 9,472,558 B1    10/2016  Cheng et al.
10,163,915 B1   12/2018  Zang et al.
(Continued)

FOREIGN PATENT DOCUMENTS

TW         202114158 A       4/2021

OTHER PUBLICATIONS

Extended European Search Report corresponding to EP 22185962.
2, mailed Jan. 4, 2023 (10 pages).
(Continued)

*Primary Examiner* — Christine S. Kim
*Assistant Examiner* — Sesha Sairaman Srinivasan
(74) *Attorney, Agent, or Firm* — Myers Bigel, P.A.

(57) ABSTRACT

Cross-coupled structures are provided. Cross-coupled structures may include a first transistor, a second transistor, a third transistor, and a fourth transistor. The first transistor, the second transistor, and the fourth transistor may be spaced apart from each other in a first direction, and the third transistor and the second transistor may be stacked in a second direction that is perpendicular to the first direction. The third transistor and the second transistor may include a common gate structure, a first portion of the common gate structure may be a gate structure of the second transistor, and a second portion of the common gate structure may be a gate structure of the third transistor.

20 Claims, 12 Drawing Sheets

(51) Int. Cl.

| | | |
|---|---|---|
| *H01L 23/528* | (2006.01) | |
| *H01L 23/535* | (2006.01) | |
| *H03B 5/12* | (2006.01) | |
| *H10D 30/67* | (2025.01) | |
| *H10D 62/10* | (2025.01) | |
| *H10D 84/01* | (2025.01) | |
| *H10D 84/03* | (2025.01) | |
| *H10D 84/85* | (2025.01) | |
| *H10D 88/00* | (2025.01) | |
| *H10D 89/10* | (2025.01) | |

(56) References Cited

U.S. PATENT DOCUMENTS

| | | | |
|---|---|---|---|
| 10,297,592 | B2 | 5/2019 | Morrow et al. |
| 10,840,146 | B1 | 11/2020 | Paul et al. |
| 10,971,504 | B2 | 4/2021 | Rubin |
| 11,004,856 | B1 | 5/2021 | Zhang et al. |

| | | | | |
|---|---|---|---|---|
| 2006/0220134 | A1* | 10/2006 | Huo | H10B 10/125 |
| | | | | 257/351 |
| 2017/0133380 | A1* | 5/2017 | Kim | H10D 84/85 |
| 2018/0108646 | A1 | 4/2018 | Lee et al. | |
| 2019/0131309 | A1* | 5/2019 | Liaw | H01L 21/32133 |
| 2019/0288004 | A1 | 9/2019 | Smith et al. | |
| 2019/0386011 | A1 | 12/2019 | Weckx et al. | |
| 2020/0104460 | A1 | 4/2020 | Peng et al. | |
| 2020/0321355 | A1* | 10/2020 | Jeong | H10D 84/907 |
| 2021/0043630 | A1* | 2/2021 | Liebmann | H10D 88/00 |
| 2021/0098500 | A1* | 4/2021 | Wang | H10D 88/00 |
| 2021/0111028 | A1 | 4/2021 | Xie et al. | |
| 2021/0118799 | A1 | 4/2021 | Liebmann et al. | |

OTHER PUBLICATIONS

Li et al. "Skybridge-3D-CMOS: A Vertically-Composed Fine-Grained 3D CMOS Integrated Circuit Technology" IEEE Computer Society Annual Symposium on VLSI (ISVLSI), pp. 403-408 (2016).

* cited by examiner

INTEGRATED CIRCUIT DEVICES INCLUDING A CROSS-COUPLED STRUCTURE

CROSS-REFERENCE TO RELATED APPLICATION

This application claims priority to U.S. Provisional Application Ser. No. 63/232,679, entitled CROSS-COUPLE STRUCTURES FOR 3D STACKED DEVICES, filed in the USPTO on Aug. 13, 2021, the disclosure of which is hereby incorporated by reference herein in its entirety.

FIELD

The present disclosure generally relates to the field of electronics and, more particularly, to integrated circuit devices including a cross-coupled structure.

BACKGROUND

An integrated circuit device including stacked transistors has been proposed to increase the integration density thereof. To further increase the integration density, layouts and structures of a cross-coupled structure that include stacked transistors and can be implemented in a small area have been suggested.

SUMMARY

According to some embodiments of the present invention, cross-coupled structures may include a first transistor, a second transistor, a third transistor, and a fourth transistor. The first transistor, the second transistor, and the fourth transistor may be spaced apart from each other in a first direction, and the third transistor and the second transistor may be stacked in a second direction that is perpendicular to the first direction. The third transistor and the second transistor may include a common gate structure, a first portion of the common gate structure may be a gate structure of the second transistor, and a second portion of the common gate structure may be a gate structure of the third transistor.

According to some embodiments of the present invention, cross-coupled structures may include a first gate structure, a common gate structure, and a fourth gate structure. A first portion of the common gate structure may be a second gate structure, and a second portion of the common gate structure may be a third gate structure. The first gate structure, the common gate structure, and the fourth gate structure may be spaced apart from each other in a first direction.

According to some embodiments of the present invention, cross-coupled structures may include a first gate structure, a common gate structure, and a fourth gate structure. A first portion of the common gate structure may be a second gate structure, and a second portion of the common gate structure may be a third gate structure. The first gate structure, the common gate structure, and the fourth gate structure may be spaced apart from each other in a first direction. The third gate structure and the second gate structure may be stacked in a second direction that may be perpendicular to the first direction. Each of the first gate structure, the common gate structure, and the fourth gate structure may have a thickness in the second direction.

DETAILED DESCRIPTION

A cross-coupled structure may include stacked transistors. When those stacked transistors have a split gate structure that includes an insulating layer separating stacked gate structures from each other, methods of fabricating the cross-coupled structure may be complicated, and additional areas for wires may be required. According to some embodiments of the present invention, a cross-coupled structure may include a common gate structure including stacked gate structures that contact each other.

Figure 1:
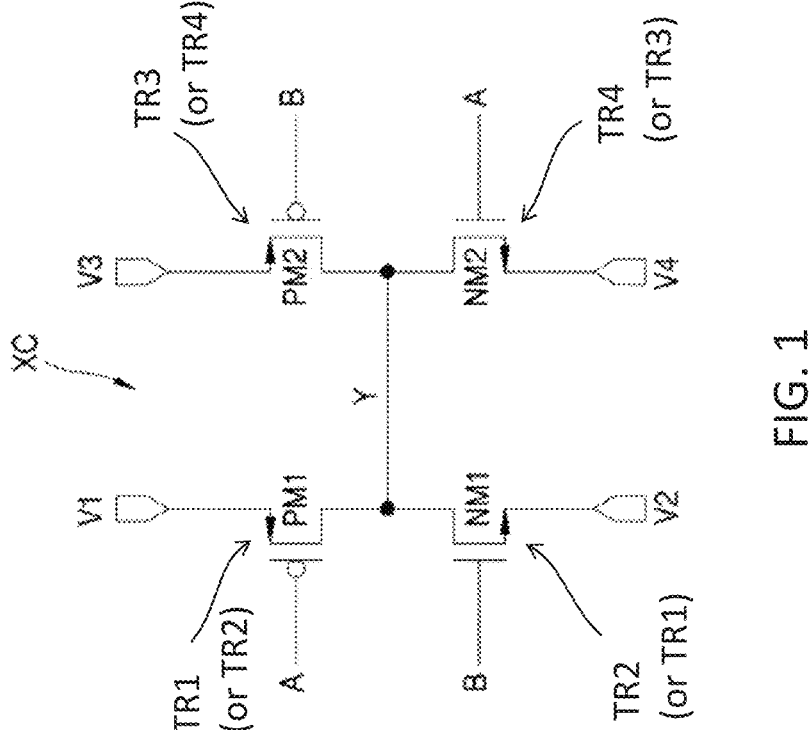
FIG. 1 is a circuit diagram of a cross-coupled structure according to some embodiments of the present invention.

FIG. 1 is a circuit diagram of a cross-coupled structure XC according to some embodiments of the present invention. Referring to FIG. 1, the cross-coupled structure XC may include a first PMOS transistor PM1 and a first NMOS transistor NM1 connected in series and may also include a second PMOS transistor PM2 and a second NMOS transistor NM2 connected in series. The cross-coupled structure XC may be a portion of various cells (e.g., standard cells) including sequential logic cells (e.g., a latch, a flip-flop, a MUX, a multiplexer, or an adder).

The first PMOS transistor PM1 may include a source connected to a first voltage terminal V1, a gate receiving a first control signal A, and a drain connected to an output node Y. The first NMOS transistor NM1 may include a drain connected to the output node Y, a gate receiving a second control signal B, and a source connected to a second voltage terminal V2. The second PMOS transistor PM2 may include a source connected to a third voltage terminal V3, a gate receiving the second control signal B, and a drain connected to the output node Y. The second NMOS transistor NM2 may include a drain connected to the output node Y, a gate receiving the first control signal A, and a source connected to a fourth voltage terminal V4.

In some embodiments, the gates of the first PMOS transistor PM1 and the second NMOS transistor NM2 are electrically connected to each other to receive the first control signal A, and the gates of the first NMOS transistor NM1 and the second PMOS transistor PM2 are electrically connected to each other to receive the second control signal B. As such, the first and second PMOS transistors PM1 and PM2 and the first and second NMOS transistors NM1 and NM2 form the cross-coupled structure XC.

In some embodiments, the first PMOS transistor PM1, the first NMOS transistor NM1, the second PMOS transistor PM2, and the second NMOS transistor NM2 may be referred to as a first transistor TR1, a second transistor TR2, a third transistor TR3, and a fourth transistor TR4, respectively, as described throughout the specification. In some embodiments, the first NMOS transistor NM1, the first PMOS transistor PM1, the second NMOS transistor NM2, and the second PMOS transistor PM2 may be referred to as a first transistor TR1, a second transistor TR2, a third transistor TR3, and a fourth transistor TR4, respectively.

The first and third transistors TR1 and TR3 may be closer to a substrate (e.g., a substrate 90 in FIG. 5) than the second and fourth transistors TR2 and TR4. Accordingly, each of the first and third transistors TR1 and TR3 may be referred to as a lower transistor, and each of the second and fourth transistors TR2 and TR4 may be referred to as an upper transistor. The lower transistors may be PMOS transistors, and the upper transistors may be NMOS transistors, as described throughout the specification. The present invention, however, is not limited thereto. In some embodiments, the lower transistors may be NMOS transistors, and the upper transistors may be PMOS transistors.

Figure 2:
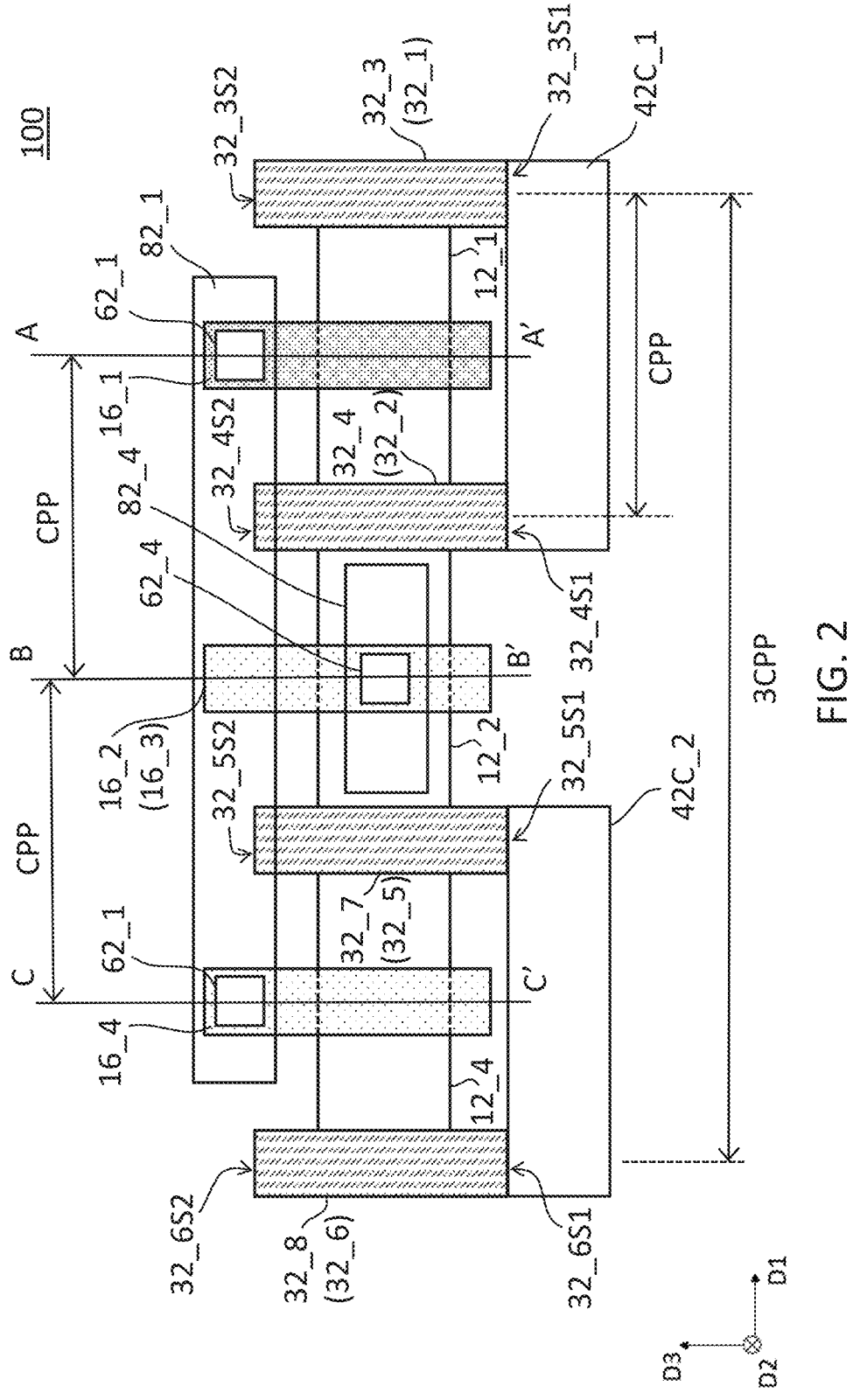
FIG. 2 is a layout of a cross-coupled structure according to some embodiments of the present invention.
Figure 3:
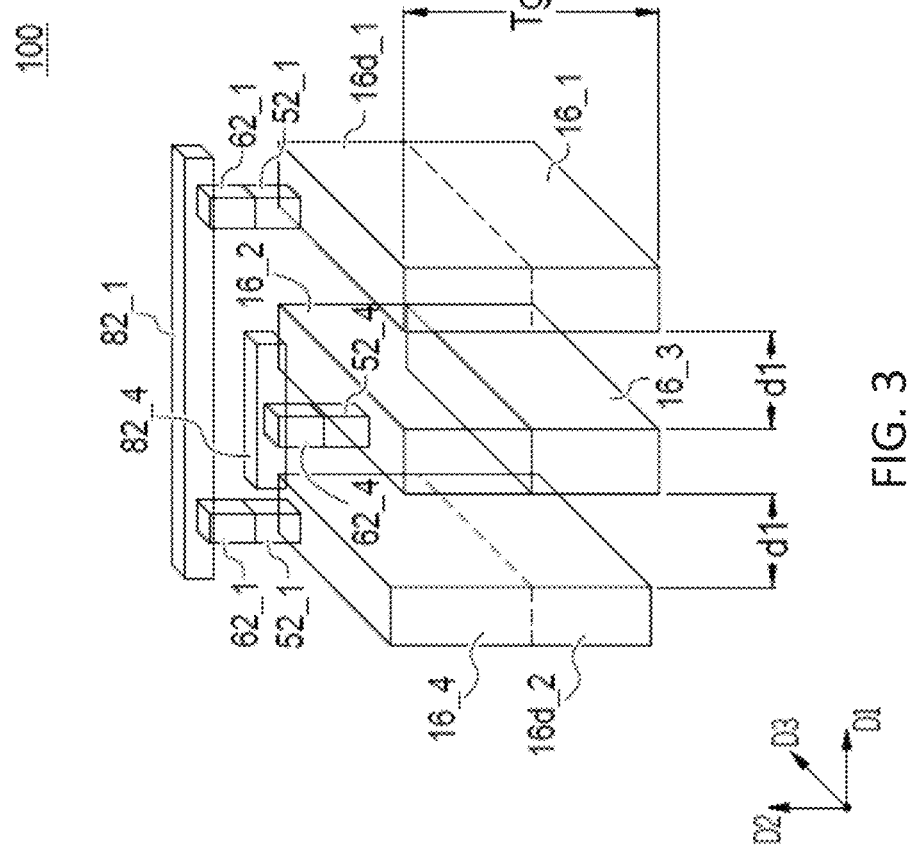
FIGS. 3 and 4 are perspective views of the cross-coupled structure of FIG. 2 according to some embodiments of the present invention.
Figure 4:
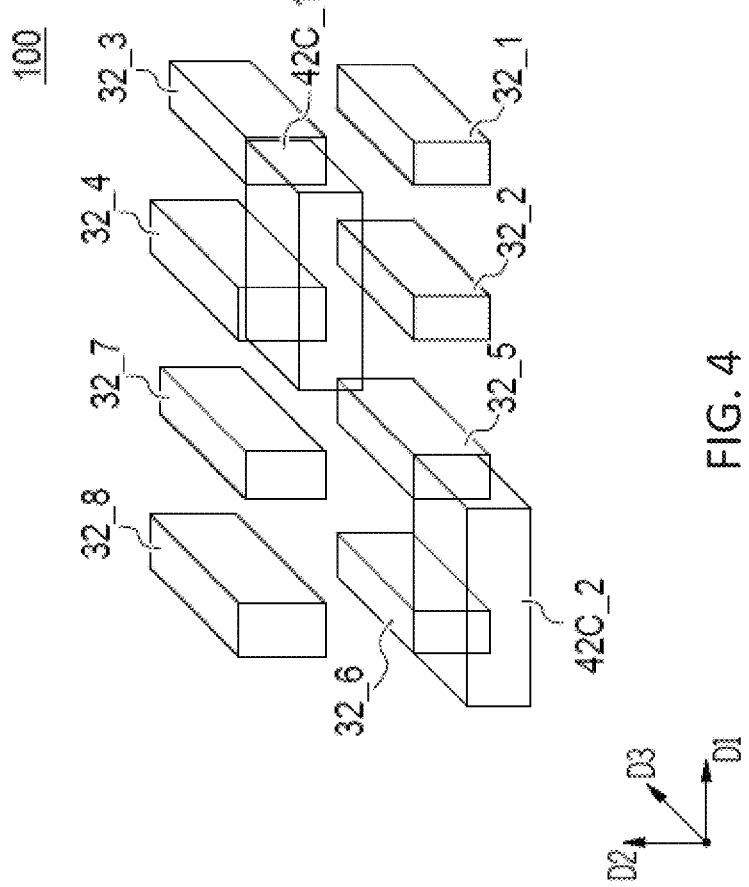
Figure 5:
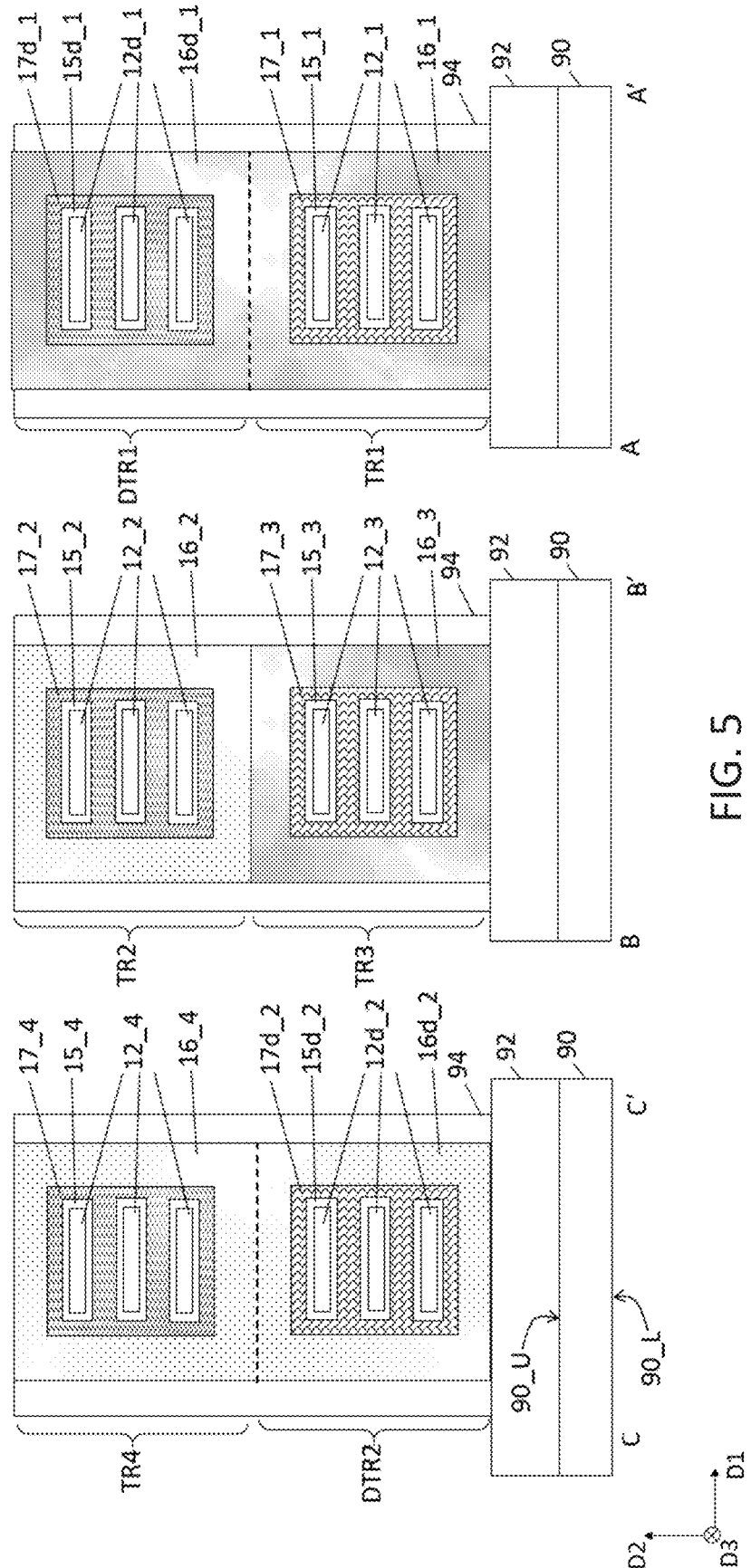
FIGS. 5 and 6 show cross-sectional views taken along the lines A-A', B-B', and C-C' in FIG. 2 according to some embodiments of the present invention.
Figure 6:
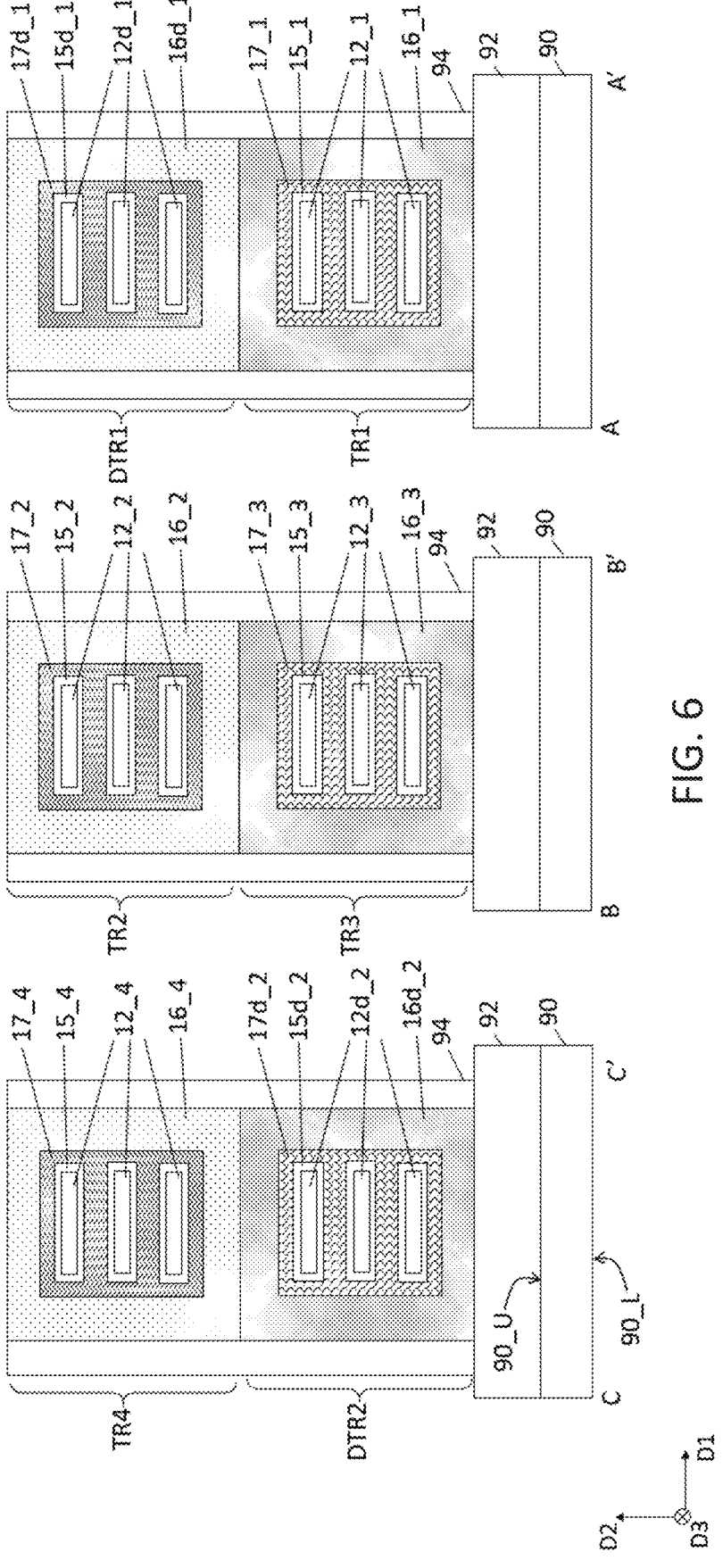

FIG. 2 is a layout of a cross-coupled structure 100 according to some embodiments of the present invention. FIGS. 3 and 4 are perspective views of the cross-coupled structure 100 according to some embodiments of the present invention. Each of FIGS. 3 and 4 shows a group of elements, rather than all elements, to simplify these drawings. FIGS. 5 and 6 are cross-sectional views of the cross-coupled structure 100 according to some embodiments of the present invention. Each of FIGS. 5 and 6 shows cross-sectional views taken along the lines A-A', B-B', and C-C' in FIG. 2 according to some embodiments of the present invention, and some elements (e.g., a first conductive wire 82_1) are omitted from FIGS. 5 and 6 to simplify these drawings.

Referring to FIGS. 2 through 5, the cross-coupled structure 100 may include a first transistor TR1, a second transistor TR2, a third transistor TR3, and a fourth transistor TR4. The first transistor TR1, the second transistor TR2, and the fourth transistor TR4 may be spaced apart from each other in a first direction D1, and the first transistor TR1, the third transistor TR3, and the fourth transistor TR4 may be spaced apart from each other in the first direction D1. The second transistor TR2 and the third transistor TR3 may be between the first transistor TR1 and the fourth transistor TR4. The third transistor TR3 and the second transistor TR2 may be stacked in a second direction D2. The first direction D1 may be different from the second direction D2. In some embodiments, the first direction D1 may be perpendicular to the second direction D2.

The cross-coupled structure 100 may also include a first dummy transistor DTR1 and a second dummy transistor DTR2. The first transistor TR1 and the first dummy transistor DTR1 may be stacked in the second direction D2, and the second dummy transistor DTR2 and the fourth transistor TR4 may be stacked in the second direction D2.

The first transistor TR1 may include a first channel layer 12_1, a first gate electrode 16_1, a first source/drain region 32_1 and a second source/drain region 32_2. The first channel layer 12_1 may contact the first and second source/drain regions 32_1 and 32_2 and may include a portion that is in the first gate electrode 16_1.

The first dummy transistor DTR1 may include a first dummy channel layer 12d_1, a first dummy gate electrode 16d_1, a third source/drain region 32_3 and a fourth source/drain region 32_4. The first dummy channel layer 12d_1 may contact the third and fourth source/drain regions 32_3 and 32_4 and may include a portion that is in the first dummy gate electrode 16d_1. The third and fourth source/drain regions 32_3 and 32_4 may be spaced apart from the first and second source/drain regions 32_1 and 32_2 in the second direction D2.

The second transistor TR2 may include a second channel layer 12_2 and a second gate electrode 16_2. A portion of the second channel layer 12_2 may be in the second gate electrode 16_2. The third transistor TR3 may include a third channel layer 12_3 and a third gate electrode 16_3. A portion of the third channel layer 12_3 may be in the third gate electrode 16_3.

The second dummy transistor DTR2 may include a second dummy channel layer 12d_2, a second dummy gate electrode 16d_2, a fifth source/drain region 32_5 and a sixth source/drain region 32_6. The second dummy channel layer 12d_2 may contact the fifth and sixth source/drain regions 32_5 and 32_6 and may include a portion that is in the second dummy gate electrode 16d_2. The first dummy transistor DTR1 and the second dummy transistor DTR2 may not be used as transistors that function as transistors. For example, each of the first dummy transistor DTR1 and the second dummy transistor DTR2 may not be turned on or turned off in response to voltages applied to nodes thereof.

The fourth transistor TR4 may include a fourth channel layer 12_4, a fourth gate electrode 16_4, a seventh source/drain region 32_7 and an eight source/drain region 32_8. The fourth channel layer 12_4 may contact the seventh and eight source/drain regions 32_7 and 32_8 and may include a portion that is in the fourth gate electrode 16_4.

The second channel layer 12_2 may contact the fourth source/drain region 32_4 and the seventh source/drain region 32_7, and the fourth source/drain region 32_4 and the seventh source/drain region 32_7 may be source/drain regions of the second transistor TR2. The third channel layer 12_3 may contact the second source/drain region 32_2 and the fifth source/drain region 32_5, and the second source/drain region 32_2 and the fifth source/drain region 32_5 may be source/drain regions of the third transistor TR3.

Referring to FIG. 2, a distance between a center of the first gate electrode 16_1 in the first direction D1 and a center of the second gate electrode 16_2 in the first direction D1 may be one critical poly pitch or contacted poly pitch (CPP). A distance between the center of the second gate electrode 16_2 in the first direction D1 and a center of the fourth gate electrode 16_4 in the first direction D1 may also be one CPP. Further, a distance between centers of two adjacent source/drain regions (e.g., the first and second source/drain regions 32_1 and 32_2) in the first direction D1 may be one CPP. The cross-coupled structure 100 may be designed in an area corresponding to three CPP (3CPP), and the cross-coupled structure 100 may be referred to as a "3CPP cross-coupled structure."

The cross-coupled structure 100 may further include a first conductive wire 82_1 electrically connected to both the first gate electrode 16_1 and the fourth gate electrode 16_4. The first conductive wire 82_1 may be electrically connected to each of the first gate electrode 16_1 and the fourth gate electrode 16_4 through a first vertical contact 52_1 and a first via contact 62_1. The cross-coupled structure 100 may further include a fourth conductive wire 82_4 electrically connected to the second gate electrode 16_2 and the third gate electrode 16_3. The fourth conductive wire 82_4 may be electrically connected to the second gate electrode 16_2 through a fourth vertical contact 52_4 and a fourth via contact 62_4. In some embodiments, the first vertical contacts 52_1 may contact the first dummy gate electrode 16d_1 and the fourth gate electrode 16_4, respectively, and the fourth vertical contact 52_4 may contact the second gate electrode 16_2.

The first conductive wire 82_1 and the fourth conductive wire 82_4 may be spaced apart from each other in a third direction D3. The third direction D3 may be different from both the first and second directions D1 and D2. In some embodiments, the third direction D3 may be perpendicular to both the first and second directions D1 and D2. Each of the first conductive wire 82_1 and the fourth conductive wire 82_4 may extend in the first direction D1 as illustrated in FIGS. 2 and 3. As used herein, "an element A extending in a direction X" (or similar language) may mean that the element A extends longitudinally in the direction X.

In some embodiments, the first gate electrode 16_1 and the third gate electrode 16_3 may be spaced apart from each other in the first direction D1 by a first distance dl, and the third gate electrode 16_3 and the second dummy gate electrode 16d_2 may be spaced apart from each other in the first direction D1 by the first distance dl as illustrated in FIG. 3.

The first gate electrode 16_1 and the first dummy gate electrode 16d_1 may contact each other and may be stacked in the second direction D2. The third gate electrode 16_3 and the second gate electrode 16_2 may contact each other and may be stacked in the second direction D2. The second dummy gate electrode 16d_2 and the fourth gate electrode 16_4 may contact each other and may be stacked in the second direction D2.

Each of third, fourth, fifth and sixth source/drain regions 32_3, 32_4, 32_5 and 32_6 may include a first surface (e.g., 32_3S1, 32_4S1, 32_5S1 and 32_6S1) and a second surface (e.g., 32_3S2, 32_4S2, 32_5S2 and 32_6S2) that is opposite the first surface and is spaced apart from the first surface in the third direction D3. The cross-coupled structure 100 may further include a first conductive contact structure 42C_1 and a second conductive contact structure 42C_2. The first conductive contact structure 42C_1 may contact the first surfaces 32_3S1 and 32_4S1 of the third and fourth source/drain regions 32_3 and 32_4, and the third and fourth source/drain regions 32_3 and 32_4 may be electrically connected to each other through the first conductive contact structure 42C_1. The second conductive contact structure 42C_2 may contact the first surfaces 32_5S1 and 32_6S1 of the fifth and sixth source/drain regions 32_5 and 32_6, and the fifth and sixth source/drain regions 32_5 and 32_6 may be electrically connected to each other through the second conductive contact structure 42C_2.

Referring to FIG. 4, the first conductive contact structure 42C_1 may overlap the third and fourth source/drain regions 32_3 and 32_4 in the third direction D3, and the second conductive contact structure 42C_2 may overlap the fifth and sixth source/drain regions 32_5 and 32_6 in the third direction D3. As used herein, "an element A overlapping an element B in a direction W" (or similar language) may mean that at least one line extending in the direction W can be drawn that intersects both elements A and B.

Referring to FIG. 5, the first, second, third and fourth transistors TR1, TR2, TR3 and TR4, and the first and second dummy transistors DTR1 and DTR2 may be provided on a substrate 90. The substrate 90 may include an upper surface 90_U facing the first, second, third and fourth transistors TR1, TR2, TR3 and TR4, and a lower surface 90_L that is opposite the upper surface 90_U of the substrate 90. The first direction D1 and the third direction D3 may be parallel to the upper surface 90_U of the substrate 90, and the second direction D2 may be perpendicular to the upper surface 90_U of the substrate 90. A first insulating layer 92 and a second insulating layer 94 may be provided on the substrate 90.

The first transistor TR1, the third transistor TR3 and the second dummy transistor DTR2 may include a first gate insulating layer 15_1, a third gate insulating layer 15_3, and a second dummy gate insulating layer 15d_2, respectively, and a first gate work function layer 17_1, a third gate work function layer 17_3, and a second dummy gate work function layer 17d_2, respectively. The first dummy transistor DTR1, the second transistor TR2 and the fourth transistor TR4 may include a first dummy gate insulating layer 15d_1, a second gate insulating layer 15_2, and a fourth gate insulating layer 15_4, respectively, and a first dummy gate work function layer 17d_1, a second gate work function layer 17_2, and a fourth gate work function layer 17_4.

In some embodiments, the first gate electrode 16_1 and the first dummy gate electrode 16d_1 may include the same layer (e.g., the same metal layer), and an interface between the first gate electrode 16_1 and the first dummy gate electrode 16d_1 may not be visible. The first gate electrode 16_1, the first gate work function layer 17_1 and the first dummy gate electrode 16d_1 may collectively function as a gate structure of the first transistor TR1 and thus may be collectively a first gate structure.

The second dummy gate electrode 16d_2 and the fourth gate electrode 16_4 may include the same layer (e.g., the same metal layer), and an interface between the second dummy gate electrode 16d_2 and the fourth gate electrode 16_4 may not be visible. The fourth gate electrode 16_4, the fourth gate work function layer 17_4 and the second dummy gate electrode 16d_2 may collectively function as a gate structure of the fourth transistor TR4 and thus may be collectively a fourth gate structure.

The second transistor TR2 and the third transistor TR3 may include a second gate insulating layer 15_2 and a third gate insulating layer 15_3, respectively, and a second work function layer 17_2 and a third work function layer 17_3, respectively. The second gate electrode 16_2 and the second work function layer 17_2 may collectively function as a gate structure of a second transistor TR2 and thus may be collectively a second gate structure. The third gate electrode 16_3 and the third work function layer 17_3 may collectively function as a gate structure of the third transistor TR3 and thus may be collectively a third gate structure.

The second and third gate structures may contact each other as illustrated in FIG. 5 and may be a common gate structure. The common gate structure may include a first portion including the second gate electrode 16_2 and the second work function layer 17_2 and a second portion including the third gate electrode 16_3 and the third work function layer 17_3. In some embodiments, the second gate electrode 16_2 and the third gate electrode 16_3 may include the same layer (e.g., the same metal layer), and an interface between the second gate electrode 16_2 and the third gate electrode 16_3 may not be visible. In some embodiments, the second gate electrode 16_2 and the third gate electrode 16_3 may include different layers (e.g., different metal layers).

The first gate structure including the first gate electrode 16_1 and the first dummy gate electrode 16d_1, the common gate structure including the second gate electrode 16_2 and the third gate electrode 16_3, and the fourth gate structure including the fourth gate electrode 16_4 and the second dummy gate electrode 16d_2 may have a first thickness Tg in the second direction D2 as illustrated in FIG. 3.

The substrate 90 may include, for example, semiconductor material(s) (e.g., silicon, germanium, Silicon-germanium, and/or a Group III-V semiconductor compound). The substrate 90 may be a bulk substrate including only semiconductor material(s) or may include an insulating layer (e.g., a barrier insulating layer) on or below a semiconductor layer.

Each of the channel layers (e.g., the first, second, third and fourth channel layers 12_1, 12_2, 12_3 and 12_4 and the first and second dummy channel layers 12d_1 and 12d_2) may include, for example, semiconductor material(s) (e.g., silicon, germanium, silicon-germanium, and/or a Group III-V semiconductor compound). Each of the channel layers may be, for example, a nanosheet. In some embodiments, the nanosheet may have a thickness in a range of from 1 nm to 100 nm (e.g., 5 nm to 10 nm) in the second direction D2. In some embodiments, each of the channel layers may be a fin-shaped channel layer or a nanowire.

Each of the gate insulating layers (e.g., the first, second, third and fourth gate insulating layer 15_1, 15_2, 15_3 and 15_4 and the first and second dummy gate insulating layer 15d_1 and 15d_2) may include, for example, a silicon oxide layer and/or a high k dielectric layer including a high k material (e.g., hafnium silicate, zirconium silicate, hafnium dioxide and/or zirconium dioxide).

Each of the source/drain regions (e.g., the first, second, third, fourth, fifth, sixth, seventh, and eight source/drain regions 32_1, 32_2, 32_3, 32_4, 32_5, 32_6, 32_7 and 32_8) may include, for example, semiconductor material(s) (e.g., silicon, germanium and silicon-germanium). Each of the first, second, fifth and sixth source/drain regions 32_1, 32_2, 32_5 and 32_6 may include impurities having a P type conductivity (e.g., boron (B), (Ga), aluminum (Al) and/or indium (In)), and each of the third, fourth, seventh and eight source/drain regions 32_3, 32_4, 32_7 and 32_8 may include impurities having an N type conductivity (e.g., phosphorus (P), arsenic (As), and/or antimony (Sb)).

Each of the first conductive contact structure 42C_1 and the second conductive contact structure 42C_2 may include, for example, semiconductor material(s) (e.g., silicon, germanium, silicon-germanium, and/or a Group III-V semiconductor compound) and may additionally include impurities. In some embodiments, each of the first conductive contact structure 42C_1 and the second conductive contact structure 42C_2 may include a metallic layer including metal(s) (e.g., tungsten (W), aluminum (Al) and/or copper (Cu)).

Each of the first and third work function layers 17_1 and 17_3 and the second dummy gate work function layer 17d_2 may include a p-type work function layer (e.g., TiN layer). Each of the second and fourth work function layers 17_2 and 17_4 and the first dummy gate work function layer 17d_1 may include an n-type work function layer (e.g., TiC layer, TiAl layer and/or TiAlC layer).

Each of the gate electrodes (e.g., the first, second, third, fourth gate electrodes 16_1, 16_2, 16_3 and 16_4 and first and second dummy gate electrode 16d_1 and 16d_2) may include, for example, tungsten (W), aluminum (Al) and/or copper (Cu).

Each of the first and second insulating layers 92 and 94 may include, for example, silicon oxide, silicon nitride, silicon oxynitride, silicon carbide and/or a low k material.

Referring to FIG. 6, the first, second, third and fourth gate structures are similar to those illustrated in FIG. 5 with a primary difference being that the first gate electrode 16_1 and the first dummy gate electrode 16d_1 may include different materials (e.g., different metal layers) as represented by different patterns, and the fourth gate electrode

16_4 and the second dummy gate electrode 16d_2 may include different materials (e.g., different metal layers) as represented by different patterns. Although FIGS. 5 and 6 illustrate that each of the transistors (i.e., the first, second, third and fourth transistors TR1, TR2, TR3 and TR4, and the first and second dummy transistors DTR1 and DTR2) include three channel layers stacked in the second direction D2, the present invention is not limited thereto. In some embodiments, each of the transistors may include a single channel layer, two channel layers stacked in the second direction D2 or four or more channel layers stacked in the second direction D2.

Figure 7:
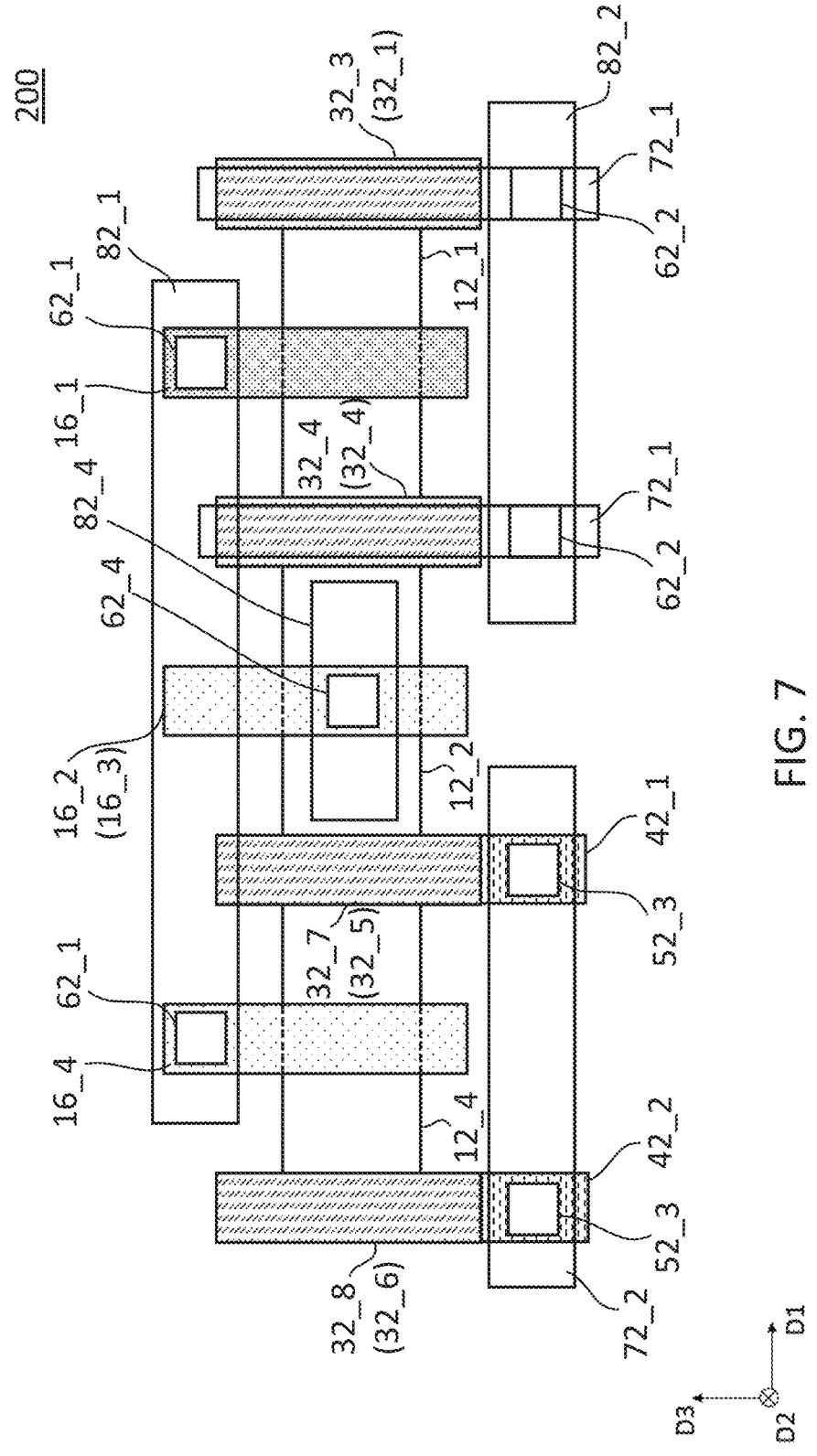
FIG. 7 is a layout of a cross-coupled structure according to some embodiments of the present invention.
Figure 8:
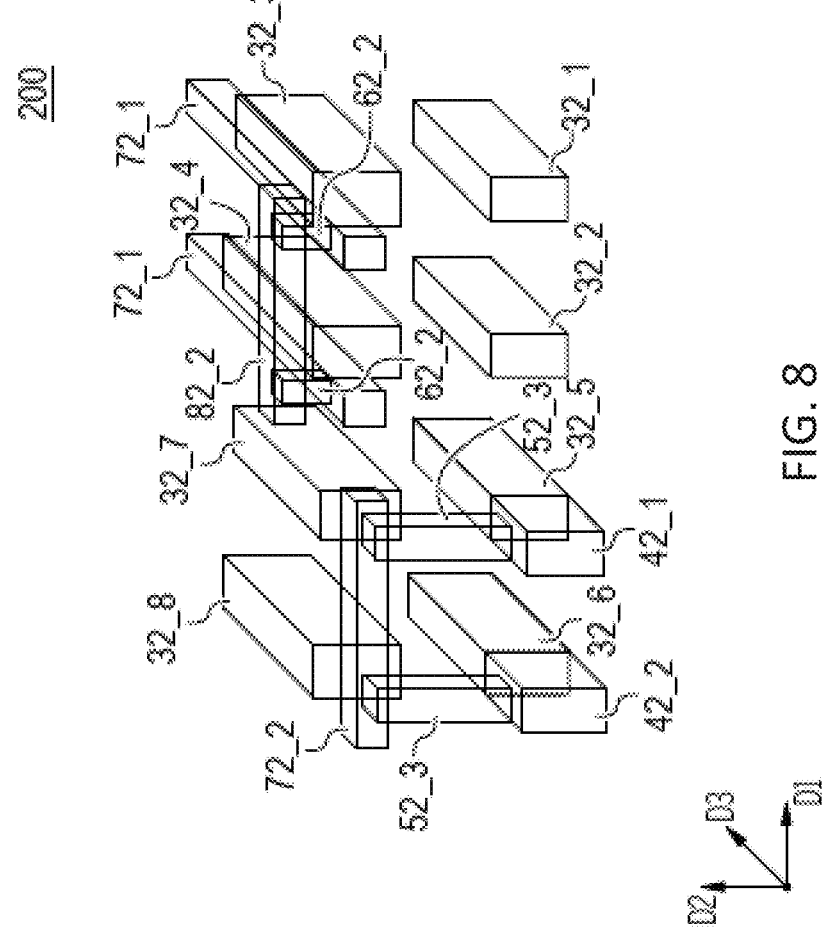
FIG. 8 is a perspective view of the cross-coupled structure in FIG. 7 according to some embodiments of the present invention.

FIG. 7 is a layout of a cross-coupled structure 200 according to some embodiments of the present invention. FIG. 8 is a perspective view of the cross-coupled structure 200 according to some embodiments of the present invention. FIG. 8 shows a group of elements, rather than all elements, to simplify this drawing.

The cross-coupled structure 200 is similar to the cross-coupled structure 100 with a primary difference being that the third and fourth source/drain regions 32_3 and 32_4 are electrically connected to each other through a second conductive wire 82_2 and the fifth and sixth source/drain regions 32_5 and 32_6 are electrically connected to each other through a second gate wire 72_2. Each of the second conductive wire 82_2 and the second gate wire 72_2 may extend in the first direction D1.

Referring to FIGS. 7 and 8, each of the third and fourth source/drain regions 32_3 and 32_4 may contact a first gate wire 72_1, and each of the first gate wires 72_1 may contact a second via contact 62_2, and the second via contacts 62_2 may contact the second conductive wire 82_2.

The cross-coupled structure 200 may further include a first lateral contact 42_1 and a second lateral contact 42_2 that may contact the first surfaces (e.g., the first surfaces 32_5S1 and 32_6S1 in FIG. 2) of the fifth and sixth source/drain regions 32_5 and 32_6, respectively. Each of the first and second lateral contacts 42_1 and 42_2 may contact a third vertical contact 52_3, and the third vertical contacts 52_3 may contact the second gate wire 72_2.

Each of the first gate wire 72_1, the second gate wire 72_2, the third vertical contact 52_3, and first and second lateral contacts 42_1 and 42_2 may include semiconductor material(s) (e.g., silicon, germanium, silicon-germanium, and/or a Group III-V semiconductor compound) and/or metallic material(s) (e.g., W, Al and/or Cu). Each of the second via contacts 62_2 and the second conductive wire 82_2 may include metallic material(s) (e.g., W, Al and/or Cu).

Figure 9:
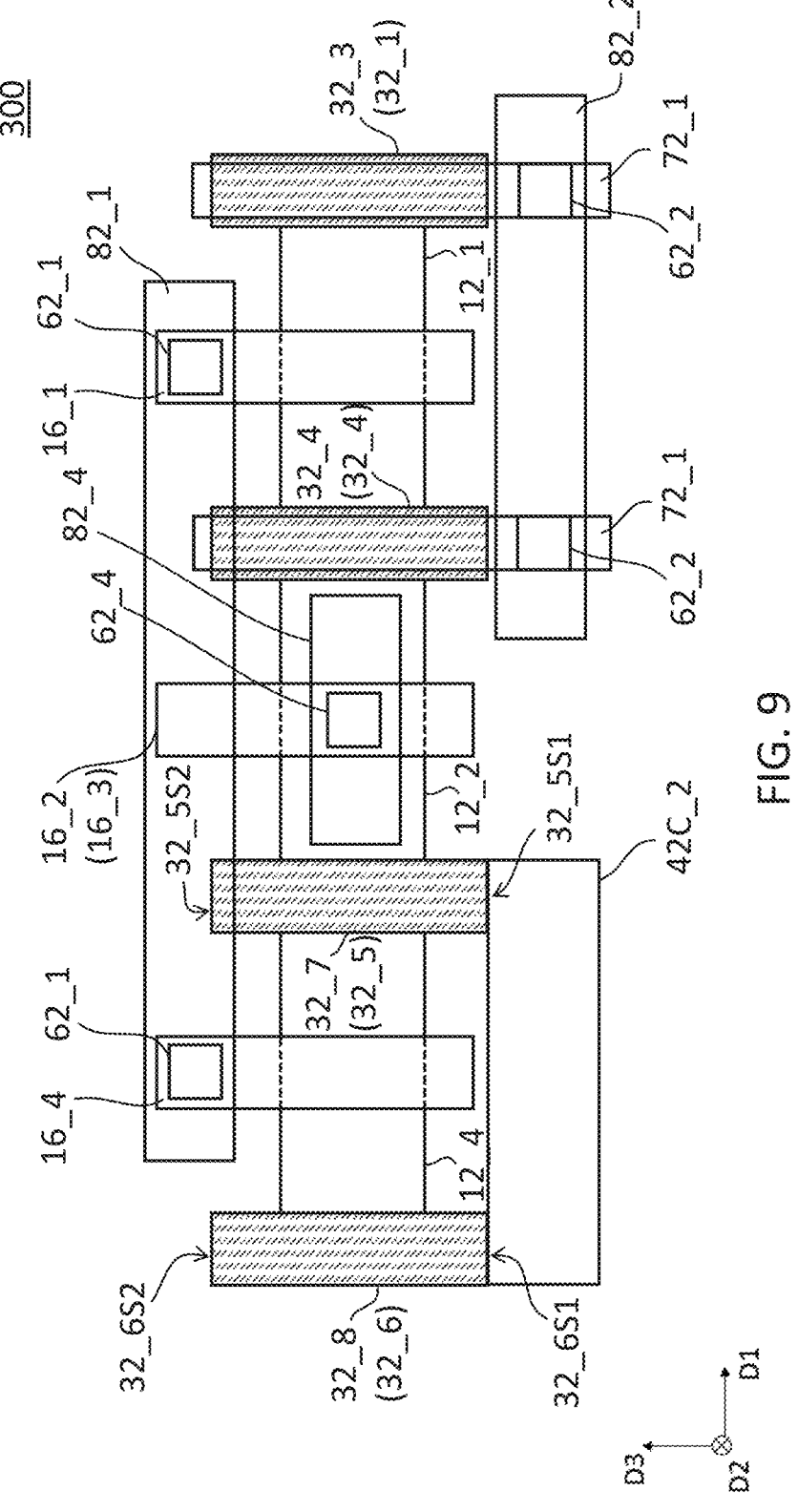
FIG. 9 is a layout of a cross-coupled structure according to some embodiments of the present invention.
Figure 10:
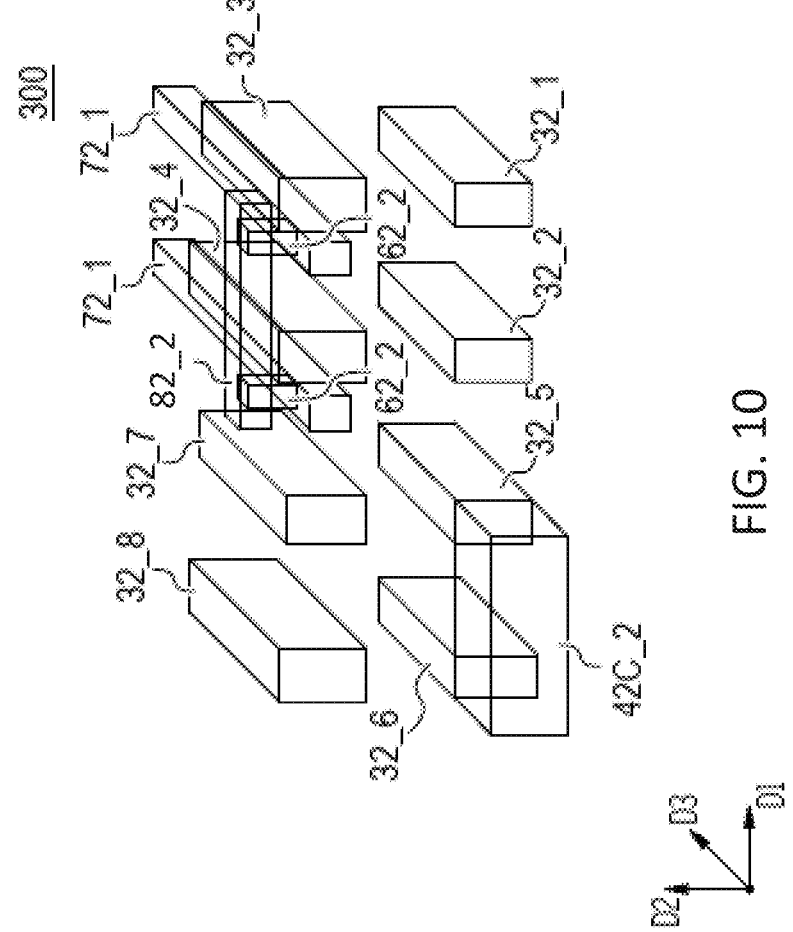
FIG. 10 is a perspective view of the cross-coupled structure in FIG. 9 according to some embodiments of the present invention.

FIG. 9 is a layout of a cross-coupled structure 300 according to some embodiments of the present invention. FIG. 10 is a perspective view of the cross-coupled structure 300 according to some embodiments of the present invention. FIG. 10 shows a group of elements, rather than all elements, to simplify this drawing.

The cross-coupled structure 300 is similar to the cross-coupled structure 100 with a primary difference being that the third and fourth source/drain regions 32_3 and 32_4 are electrically connected to each other through a second conductive wire 82_2.

The cross-coupled structure 300 may further include a second conductive contact structure 42C_2 that may contact the first surfaces (e.g., the first surfaces 32_5S1 and 32_6S1 in FIG. 2) of the fifth and sixth source/drain regions 32_5 and 32_6.

Figure 11:
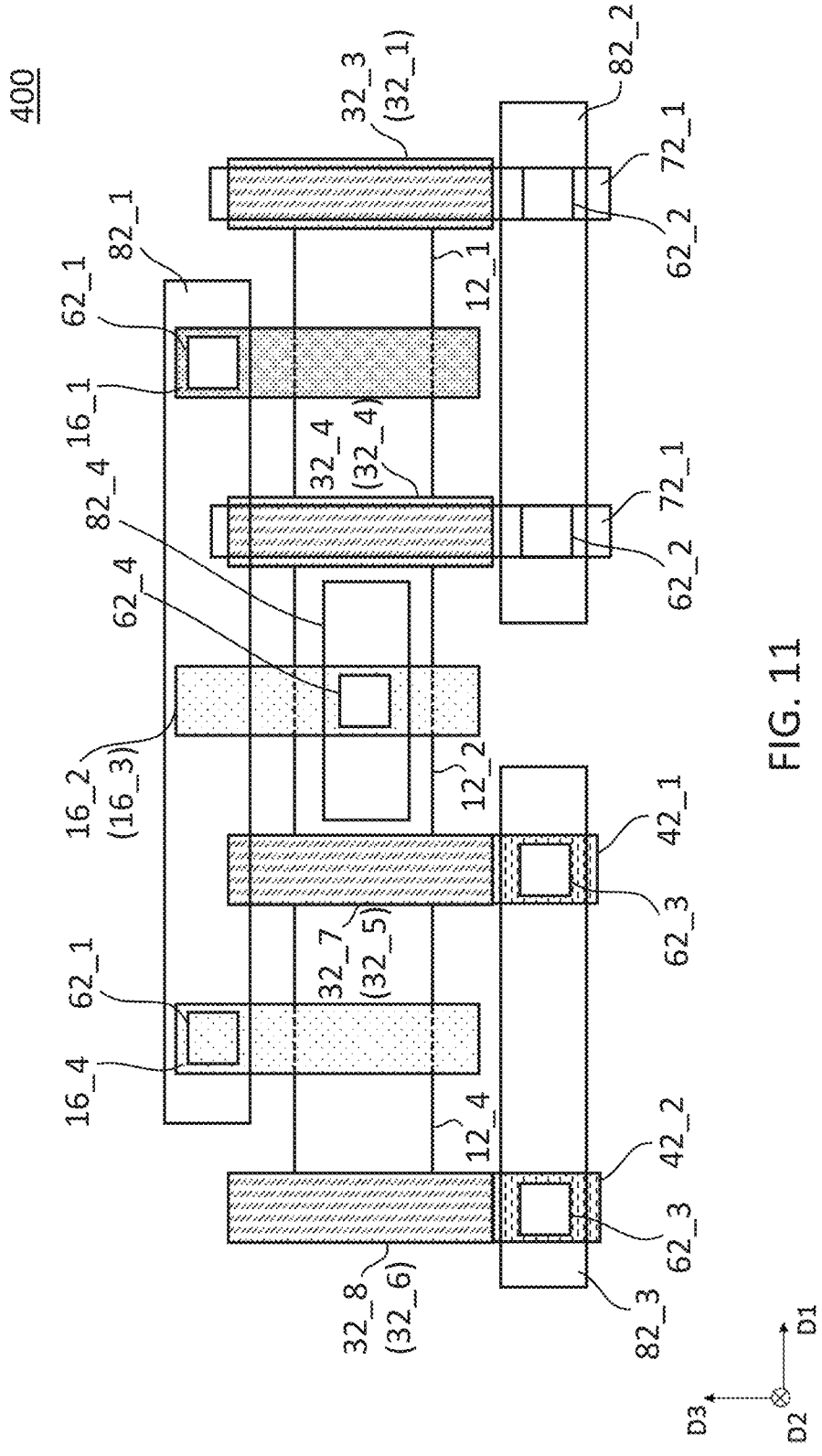
FIG. 11 is a layout of a cross-coupled structure according to some embodiments of the present invention.

FIG. 11 is a layout of a cross-coupled structure 400 according to some embodiments of the present invention.

Figure 12:
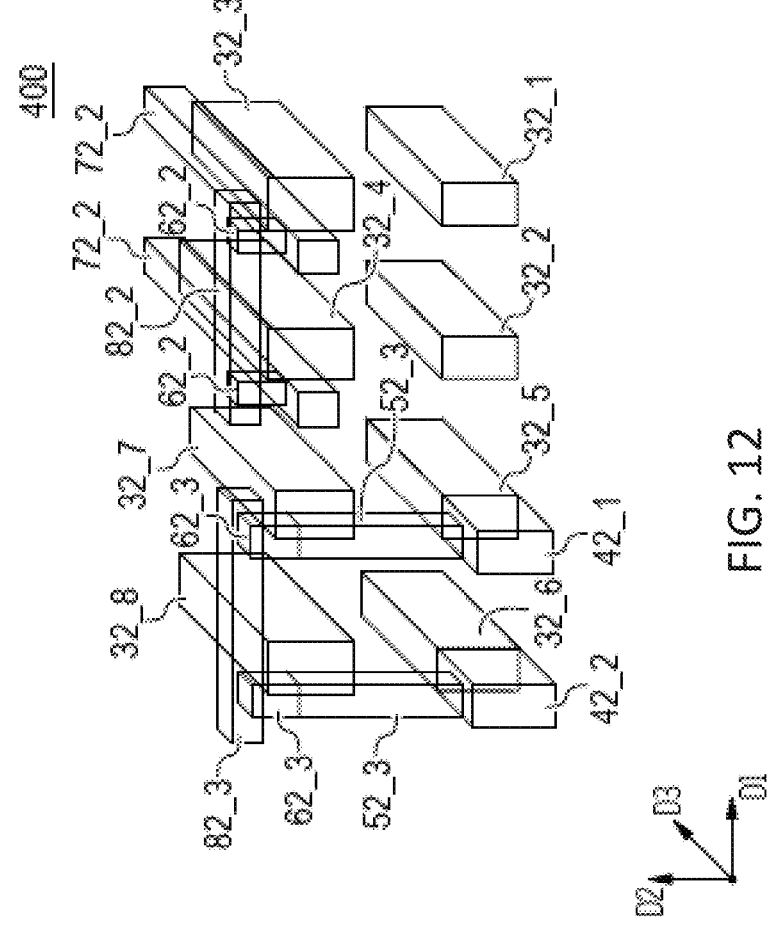
FIG. 12 is a perspective view of the cross-coupled structure in FIG. 9 according to some embodiments of the present invention.

FIG. 12 is a perspective view of the cross-coupled structure 400 according to some embodiments of the present invention. FIG. 12 shows a group of elements, rather than all elements, to simplify this drawing.

The cross-coupled structure 400 is similar to the cross-coupled structure 200 with a primary difference being that the fifth and sixth source/drain regions 32_5 and 32_6 are electrically connected to each other through a third conductive wire 82_3. Each of the third vertical contacts 52_3 may contact a third via contact 62_3, and the third via contacts 62_3 may contact the third conductive wire 82_3. Each of the third via contact 62_3 and the third conductive wire 82_3 may include metallic material(s) (e.g., W, Al and/or Cu).

The cross-coupled structure 400 may further include a first lateral contact 42_1 and a second lateral contact 42_2 that may contact the first surfaces (e.g., the first surfaces 32_5S1 and 32_6S1 in FIG. 2) of the fifth and sixth source/drain regions 32_5 and 32_6, respectively. Each of the first and second lateral contacts 42_1 and 42_2 may contact a third vertical contact 52_3, and the third vertical contacts 52_3 may contact the third via contacts 62_3, respectively.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A cross-coupled structure comprising:
   a first transistor comprising a first channel layer and a first dummy channel layer;
   a second transistor;
   a third transistor; and
   a fourth transistor comprising a second channel layer and a second dummy channel layer,
   wherein the first transistor, the second transistor, and the fourth transistor are spaced apart from each other in a first direction,
   wherein the third transistor and the second transistor are stacked in a second direction that is perpendicular to the first direction,
   wherein the third transistor and the second transistor comprise a common gate structure, a first portion of the common gate structure is a gate structure of the second transistor, and a second portion of the common gate structure is a gate structure of the third transistor,
   wherein the first transistor further comprises a first gate structure that includes a first gate electrode and a first dummy gate electrode that is in contact with the first gate electrode,
   wherein the fourth transistor further comprises a fourth gate structure that includes a second gate electrode and a second dummy gate electrode that is in contact with the second gate electrode,
   wherein the first channel layer is spaced apart from the first dummy channel layer in the second direction by the first gate electrode and the first dummy gate electrode, and
   wherein the second channel layer is spaced apart from the second dummy channel layer in the second direction by the second gate electrode and the second dummy gate electrode.

2. The cross-coupled structure of claim 1, wherein the cross-coupled structure further comprises a first conductive wire that extends in the first direction, and the first gate structure and the fourth gate structure are electrically connected to the first conductive wire.

3. The cross-coupled structure of claim 1, wherein the first transistor further comprises:
   a first source/drain region and a second source/drain region adjacent opposing side surfaces of the first gate structure, respectively; and
   a third source/drain region and a fourth source/drain region adjacent the opposing side surfaces of the first gate structure, respectively, wherein the third and fourth source/drain regions are electrically connected to each other and are spaced apart from the first and second source/drain regions in the second direction.

4. The cross-coupled structure of claim 3, wherein the cross-coupled structure further comprises a first conductive contact structure that overlaps the third and fourth source/drain regions in a third direction that is perpendicular to the first and second directions, and the third and fourth source/drain regions are electrically connected to the first conductive contact structure.

5. The cross-coupled structure of claim 4, wherein each of the third and fourth source/drain regions comprises a first surface and a second surface that is opposite the first surface and is spaced apart from the first surface in the third direction, and the first conductive contact structure contacts the first surfaces of the third and fourth source/drain regions.

6. The cross-coupled structure of claim 3, wherein each of the third and fourth source/drain regions comprises a first surface and a second surface that is opposite the first surface and is spaced apart from the first surface in a third direction that is perpendicular to the first direction and the second direction, and wherein the cross-coupled structure further comprises:

lateral contact structures contacting the first surfaces of the third and fourth source/drain regions, respectively; and a second conductive contact structure that extends in the first direction and is spaced apart from the lateral contact structures in the second direction, wherein the third and fourth source/drain regions are electrically connected to the second conductive contact structure through the lateral contact structures.

7. The cross-coupled structure of claim 3, wherein the cross-coupled structure further comprises a second conductive wire that extends in the first direction, and the third and fourth source/drain regions are electrically connected to the second conductive wire.

8. The cross-coupled structure of claim 7, wherein the third source/drain region is between the first source/drain region and the second conductive wire.

9. The cross-coupled structure of claim 7, wherein the fourth transistor further comprises:

a fifth source/drain region and a sixth source/drain region adjacent opposing side surfaces of the fourth gate structure, respectively; and a seventh source/drain region and an eight source/drain region adjacent the opposing side surfaces of the fourth gate structure, respectively, wherein the seventh and eight source/drain regions are spaced apart from the fifth and sixth source/drain regions in the second direction, wherein the cross-coupled structure further comprises a third conductive wire that extends in the first direction and is electrically connected to the fifth and sixth source/drain regions, and wherein each of the second and third conductive wires comprises a third surface and a fourth surface that is opposite the third surface and is spaced apart from the third surface in the second direction, and the third surfaces of the second and third conductive wires are coplanar.

10. The cross-coupled structure of claim 1, wherein the second transistor and the third transistor have different conductivity types.

11. The cross-coupled structure of claim 1, wherein the second transistor or the third transistor is between the first transistor and the fourth transistor.

12. A cross-coupled structure comprising:

a first gate structure that comprises a first gate electrode and a first dummy gate electrode that is in contact with the first gate electrode;

a first channel layer in the first gate electrode;

a first dummy channel layer in the first dummy gate electrode;

a common gate structure, wherein a first portion of the common gate structure is a second gate structure, and a second portion of the common gate structure is a third gate structure;

a fourth gate structure that comprises a second gate electrode and a second dummy gate electrode that is in contact with the second gate electrode;

a second channel layer in the second gate electrode; and a second dummy channel layer in the second dummy gate electrode, wherein the first gate structure, the common gate structure, and the fourth gate structure are spaced apart from each other in a first direction, wherein the first gate electrode and the first dummy gate electrode are between the first channel layer and the first dummy channel layer in a second direction that is perpendicular to the first direction, and wherein the second gate electrode and the second dummy gate electrode are between the second channel layer and the second dummy channel layer in the second direction.

13. The cross-coupled structure of claim 12, wherein the common gate structure is spaced apart from the first gate structure in the first direction by a first distance and is spaced apart from the fourth gate structure in the first direction by the first distance.

14. The cross-coupled structure of claim 12, wherein the first gate structure and the fourth gate structure are electrically connected to each other.

15. The cross-coupled structure of claim 12, further comprising:

a first source/drain region and a second source/drain region adjacent opposing side surfaces of the first gate structure, respectively; and a third source/drain region and a fourth source/drain region adjacent the opposing side surfaces of the first gate structure, respectively, wherein the third and fourth source/drain regions are electrically connected to each other and are spaced apart from the first and second source/drain regions in the second direction.

16. The cross-coupled structure of claim 12, wherein the common gate structure is between the first gate structure and the fourth gate structure.

17. A cross-coupled structure comprising:

a first gate structure that comprises a first gate electrode and a first dummy gate electrode that is in contact with the first gate electrode;

a first channel layer in the first gate electrode;

a first dummy channel layer in the first dummy gate electrode;

a common gate structure, wherein a first portion of the common gate structure is a second gate structure, and a second portion of the common gate structure is a third gate structure; and a fourth gate structure that comprises a second gate electrode and a second dummy gate electrode that is in contact with the second gate electrode;

a second channel layer in the second gate electrode; and a second dummy channel layer in the second dummy gate electrode, wherein the first gate structure, the common gate structure, and the fourth gate structure are spaced apart from each other in a first direction, wherein the third gate structure and the second gate structure are stacked in a second direction that is perpendicular to the first direction, wherein each of the first gate structure, the common gate structure, and the fourth gate structure has a thickness in the second direction, wherein the first gate electrode and the first dummy gate electrode are between the first channel layer and the first dummy channel layer in the second direction, and wherein the second gate electrode and the second dummy gate electrode are between the second channel layer and the second dummy channel layer in the second direction.

18. The cross-coupled structure of claim 17, further comprising a conductive wire that extends in the first direction and is spaced apart from the first and fourth gate structures in the second direction, wherein the first and fourth gate structures are electrically connected to the conductive wire.

19. The cross-coupled structure of claim 17, further comprising:

a first source/drain region and a second source/drain region adjacent opposing side surfaces of the first gate structure, respectively, wherein each of the first and second source/drain regions comprises a first surface and a second surface that is opposite the first surface and is spaced apart from the first surface in a third direction that is perpendicular to the first and second directions; and lateral contacts respectively contacting the first surfaces of the first and second source/drain regions, wherein the first and second source/drain regions are electrically connected to each other through the lateral contacts.

20. The cross-coupled structure of claim 19, further comprising a conductive wire that is spaced apart from the lateral contacts in the second direction, wherein the lateral contacts are electrically connected to the conductive wire.

* * * * *